(12) United States Patent
Fink

(10) Patent No.: US 7,552,521 B2
(45) Date of Patent: Jun. 30, 2009

(54) METHOD AND APPARATUS FOR IMPROVED BAFFLE PLATE

(75) Inventor: Steven T. Fink, Mesa, AZ (US)

(73) Assignee: Tokyo Electron Limited (JP)

( * ) Notice: Subject to any disclaimer, the term of this patent is extended or adjusted under 35 U.S.C. 154(b) by 102 days.

(21) Appl. No.: 11/006,544

(22) Filed: Dec. 8, 2004

(65) Prior Publication Data

US 2006/0118045 A1   Jun. 8, 2006

(51) Int. Cl.
  B23P 15/16   (2006.01)
  B23P 13/02   (2006.01)
  C23F 1/00    (2006.01)
  H01L 21/306  (2006.01)
  C23C 16/455  (2006.01)

(52) U.S. Cl. ............... 29/557; 118/715; 156/345.29

(58) Field of Classification Search ............ 118/715; 156/345.29; 29/557, 558
See application file for complete search history.

(56) References Cited

U.S. PATENT DOCUMENTS

| | | | |
|---|---|---|---|
| 4,209,357 A | 6/1980 | Gorin et al. |
| 4,263,088 A | 4/1981 | Gorin |
| 4,270,999 A | 6/1981 | Hassan et al. |
| 4,297,162 A | 10/1981 | Mundt et al. |
| 4,310,390 A | 1/1982 | Bradley et al. |
| 4,352,974 A | 10/1982 | Mizutani et al. |
| 4,357,387 A | 11/1982 | George et al. |
| 4,367,114 A | 1/1983 | Steinberg et al. |
| 4,469,619 A | 9/1984 | Ohno et al. |
| 4,534,816 A | 8/1985 | Chen et al. |
| 4,579,618 A | 4/1986 | Celestino et al. |
| 4,590,042 A | 5/1986 | Drage |
| 4,593,007 A | 6/1986 | Novinski |
| 4,612,077 A | 9/1986 | Tracy et al. |
| 4,649,858 A | 3/1987 | Sakai et al. |
| 4,780,169 A | 10/1988 | Stark et al. |
| 4,792,378 A | 12/1988 | Rose et al. |
| 4,820,371 A | 4/1989 | Rose |
| 4,842,683 A | 6/1989 | Cheng et al. |
| 4,854,263 A | 8/1989 | Chang et al. |
| 4,877,757 A | 10/1989 | York et al. |
| 4,985,102 A | 1/1991 | Chatsick et al. |
| 5,000,113 A | 3/1991 | Wang et al. |
| 5,006,220 A | 4/1991 | Hijikata et al. |

(Continued)

FOREIGN PATENT DOCUMENTS

DE   94 21 671   7/1996

(Continued)

OTHER PUBLICATIONS

International Preliminary Report on Patentability issued in counterpart International Application No. PCT/US2006/000591, dated Oct. 18, 2007.

(Continued)

*Primary Examiner*—Jeffrie R Lund

(57) ABSTRACT

An apparatus related to plasma chambers used for processing semiconductor substrates and specifically to improvements in pumping baffle plates used in plasma sources. An apparatus and method for making a baffle plate assembly formed from a modified baffle plate blank wherein a variety of pumping features are formed in the baffle plate blank and opened in a planar material removal operation.

16 Claims, 7 Drawing Sheets

U.S. PATENT DOCUMENTS

| | | |
|---|---|---|
| 5,074,456 A | 12/1991 | Degner et al. |
| 5,126,102 A | 6/1992 | Takahashi et al. |
| 5,134,965 A | 8/1992 | Tokuda et al. |
| 5,180,467 A | 1/1993 | Cook et al. |
| 5,334,462 A | 8/1994 | Vine et al. |
| 5,362,335 A | 11/1994 | Rungta |
| 5,366,585 A | 11/1994 | Robertson et al. |
| 5,367,838 A | 11/1994 | Visaisouk et al. |
| 5,411,568 A | 5/1995 | Moore |
| 5,423,936 A | 6/1995 | Tomita et al. |
| 5,426,310 A | 6/1995 | Tamada et al. |
| 5,429,070 A | 7/1995 | Campbell et al. |
| 5,472,565 A | 12/1995 | Mundt et al. |
| 5,484,752 A | 1/1996 | Waku et al. |
| 5,489,449 A | 2/1996 | Umeya et al. |
| 5,494,713 A | 2/1996 | Ootuki |
| 5,521,790 A | 5/1996 | Ruckel et al. |
| 5,529,657 A | 6/1996 | Ishii |
| 5,534,356 A | 7/1996 | Mahulikar et al. |
| 5,534,751 A | 7/1996 | Lenz et al. |
| 5,551,190 A | 9/1996 | Yamagishi et al. |
| 5,556,501 A | 9/1996 | Collins et al. |
| 5,569,356 A | 10/1996 | Lenz et al. |
| 5,593,540 A | 1/1997 | Tomita et al. |
| 5,595,627 A | 1/1997 | Inazawa et al. |
| 5,614,055 A | 3/1997 | Fairbairn et al. |
| 5,637,237 A | 6/1997 | Oehrlein et al. |
| 5,641,375 A | 6/1997 | Nitescu et al. |
| 5,651,723 A | 7/1997 | Bjornard et al. |
| 5,680,013 A | 10/1997 | Dornfest et al. |
| 5,716,485 A | 2/1998 | Salimian et al. |
| 5,725,960 A | 3/1998 | Konishi et al. |
| 5,746,875 A | 5/1998 | Maydan et al. |
| 5,759,360 A | 6/1998 | Ngan et al. |
| 5,798,016 A | 8/1998 | Oehrlein et al. |
| 5,820,723 A | 10/1998 | Benjamin et al. |
| 5,834,070 A | 11/1998 | Movchan et al. |
| 5,851,343 A | 12/1998 | Hsu et al. |
| 5,856,240 A | 1/1999 | Sinha et al. |
| 5,868,848 A | 2/1999 | Tsukamoto |
| 5,879,575 A | 3/1999 | Tepman et al. |
| 5,882,411 A | 3/1999 | Zhao et al. |
| 5,885,356 A | 3/1999 | Zhao et al. |
| 5,885,402 A | 3/1999 | Esquibel |
| 5,888,907 A | 3/1999 | Tomoyasu et al. |
| 5,891,253 A | 4/1999 | Wong et al. |
| 5,891,350 A | 4/1999 | Shan et al. |
| 5,892,278 A | 4/1999 | Horita |
| 5,894,887 A | 4/1999 | Kelsey et al. |
| 5,895,586 A | 4/1999 | Kaji et al. |
| 5,900,064 A | 5/1999 | Kholodenko |
| 5,900,103 A | 5/1999 | Tomoyasu et al. |
| 5,902,763 A | 5/1999 | Waku et al. |
| 5,904,778 A | 5/1999 | Lu et al. |
| 5,911,852 A | 6/1999 | Katayama et al. |
| 5,919,332 A | 7/1999 | Koshiishi et al. |
| 5,925,228 A | 7/1999 | Panitz et al. |
| 5,944,902 A | 8/1999 | Redeker et al. |
| 5,948,521 A | 9/1999 | Dlugosch et al. |
| 5,952,054 A | 9/1999 | Sato et al. |
| 5,952,060 A | 9/1999 | Ravi |
| 5,955,182 A | 9/1999 | Yasuda et al. |
| 5,968,377 A | 10/1999 | Yuasa et al. |
| 5,985,102 A | 11/1999 | Leiphart |
| 5,994,662 A | 11/1999 | Murugesh |
| 6,063,441 A | 5/2000 | Koai et al. |
| 6,068,729 A | 5/2000 | Shrotriya |
| 6,073,449 A | 6/2000 | Watanabe et al. |
| 6,079,356 A | 6/2000 | Umotoy et al. |
| 6,096,161 A | 8/2000 | Kim et al. |
| 6,106,625 A | 8/2000 | Koai et al. |
| 6,108,189 A | 8/2000 | Weldon et al. |
| 6,110,287 A | 8/2000 | Arai et al. |
| 6,120,640 A | 9/2000 | Shih et al. |
| 6,120,955 A | 9/2000 | Tokutake et al. |
| 6,123,791 A | 9/2000 | Han et al. |
| 6,123,804 A | 9/2000 | Babassi et al. |
| 6,129,044 A | 10/2000 | Zhao et al. |
| 6,129,808 A | 10/2000 | Wicker et al. |
| 6,139,983 A | 10/2000 | Ohashi et al. |
| 6,143,646 A | 11/2000 | Wetzel |
| 6,156,151 A | 12/2000 | Komino et al. |
| 6,170,429 B1 | 1/2001 | Schoepp et al. |
| 6,176,969 B1 | 1/2001 | Park et al. |
| 6,182,603 B1 | 2/2001 | Shang et al. |
| 6,210,486 B1 | 4/2001 | Mizukami et al. |
| 6,221,202 B1 | 4/2001 | Walko, II |
| 6,245,192 B1 | 6/2001 | Dhindsa et al. |
| 6,246,479 B1 | 6/2001 | Jung et al. |
| 6,264,788 B1 | 7/2001 | Tomoyasu et al. |
| 6,265,757 B1 | 7/2001 | Brady et al. |
| 6,266,133 B1 | 7/2001 | Miyajima et al. |
| 6,296,716 B1 | 10/2001 | Haerle et al. |
| 6,296,740 B1 | 10/2001 | Xie et al. |
| 6,335,293 B1 | 1/2002 | Luo et al. |
| 6,364,949 B1 | 4/2002 | Or et al. |
| 6,368,987 B1 | 4/2002 | Kopacz et al. |
| 6,373,573 B1 | 4/2002 | Jung et al. |
| 6,383,333 B1 | 5/2002 | Haino et al. |
| 6,383,964 B1 | 5/2002 | Nakahara et al. |
| 6,387,817 B1 | 5/2002 | Buckfeller |
| 6,394,026 B1 | 5/2002 | Wicker et al. |
| 6,413,578 B1 | 7/2002 | Stowell et al. |
| 6,415,736 B1 | 7/2002 | Hao et al. |
| 6,444,083 B1 | 9/2002 | Steger et al. |
| 6,464,843 B1 | 10/2002 | Wicker et al. |
| 6,506,685 B2 | 1/2003 | Li et al. |
| 6,514,377 B1 | 2/2003 | Morimoto |
| 6,519,037 B2 | 2/2003 | Jung et al. |
| 6,527,911 B1 | 3/2003 | Yen et al. |
| 6,533,910 B2 | 3/2003 | O'Donnell et al. |
| 6,537,419 B1 | 3/2003 | Kinnard |
| 6,537,429 B2 | 3/2003 | O'Donnell et al. |
| 6,544,380 B2 | 4/2003 | Tomoyasu et al. |
| 6,554,906 B1 | 4/2003 | Kuibira et al. |
| 6,562,186 B1 | 5/2003 | Saito et al. |
| 6,570,654 B2 | 5/2003 | Jung et al. |
| 6,583,064 B2 | 6/2003 | Wicker et al. |
| 6,590,660 B2 | 7/2003 | Jung et al. |
| 6,613,204 B2 | 9/2003 | Xie et al. |
| 6,613,442 B2 | 9/2003 | O'Donnell et al. |
| 6,627,901 B2 | 9/2003 | Martinez |
| 6,632,549 B1 | 10/2003 | Ohashi et al. |
| 6,641,697 B2 | 11/2003 | Han et al. |
| 6,646,233 B2 | 11/2003 | Kanno et al. |
| 6,663,714 B2 | 12/2003 | Mizuno et al. |
| 6,673,198 B1 | 1/2004 | Wicker |
| 6,676,803 B2 | 1/2004 | Kim |
| 6,695,929 B2 | 2/2004 | Kanekiyo et al. |
| 6,726,801 B2 | 4/2004 | Ahn |
| 6,733,620 B1 * | 5/2004 | Sugiyama et al. ...... 156/345.29 |
| 6,738,862 B1 | 5/2004 | Ross et al. |
| 6,738,863 B2 | 5/2004 | Butterworth et al. |
| 6,771,483 B2 | 8/2004 | Harada et al. |
| 6,776,873 B1 | 8/2004 | Sun et al. |
| 6,783,863 B2 | 8/2004 | Harada et al. |
| 6,783,875 B2 | 8/2004 | Yamada et al. |
| 6,798,519 B2 | 9/2004 | Nishimoto et al. |
| 6,805,135 B1 | 10/2004 | Hirota et al. |
| 6,805,952 B2 | 10/2004 | Chang et al. |
| 6,806,949 B2 | 10/2004 | Ludviksson et al. |
| 6,811,651 B2 | 11/2004 | Long |
| 6,830,622 B2 | 12/2004 | O'Donnell et al. |
| 6,833,279 B2 | 12/2004 | Choi |

| Patent Number | Date | Inventor | Class |
|---|---|---|---|
| 6,837,966 B2 * | 1/2005 | Nishimoto et al. | 156/345.29 |
| 6,852,433 B2 | 2/2005 | Maeda | |
| 6,863,594 B2 | 3/2005 | Preising | |
| 6,875,477 B2 | 4/2005 | Trickett et al. | |
| 6,884,516 B2 | 4/2005 | Harada et al. | |
| 6,894,769 B2 | 5/2005 | Ludviksson et al. | |
| 6,896,785 B2 | 5/2005 | Shatrov et al. | |
| 6,963,043 B2 | 11/2005 | Fink | |
| 7,001,482 B2 * | 2/2006 | Landis et al. | 156/345.55 |
| 7,137,353 B2 | 11/2006 | Saigusa et al. | |
| 7,147,749 B2 | 12/2006 | Nishimoto et al. | |
| 7,163,585 B2 | 1/2007 | Nishimoto et al. | |
| 7,166,166 B2 | 1/2007 | Saigusa et al. | |
| 7,166,200 B2 | 1/2007 | Saigusa et al. | |
| 7,204,912 B2 | 4/2007 | Saigusa et al. | |
| 7,282,112 B2 | 10/2007 | Nishimoto et al. | |
| 7,300,537 B2 | 11/2007 | O'Donnell et al. | |
| 7,311,797 B2 | 12/2007 | O'Donnell et al. | |
| 7,364,798 B2 | 4/2008 | Harada et al. | |
| 2001/0000104 A1 | 4/2001 | Li et al. | |
| 2001/0003271 A1 | 6/2001 | Otsuki | |
| 2001/0050144 A1 | 12/2001 | Nishikawa et al. | |
| 2002/0011215 A1 | 1/2002 | Tei et al. | |
| 2002/0018902 A1 | 2/2002 | Tsukatani et al. | |
| 2002/0076508 A1 | 6/2002 | Chiang et al. | |
| 2002/0086118 A1 | 7/2002 | Chang et al. | |
| 2002/0086501 A1 | 7/2002 | O'Donnell et al. | |
| 2002/0086545 A1 | 7/2002 | O'Donnell et al. | |
| 2002/0086553 A1 * | 7/2002 | O'Donnell et al. | 438/761 |
| 2002/0090464 A1 | 7/2002 | Jiang et al. | |
| 2002/0142611 A1 | 10/2002 | O'Donnell et al. | |
| 2002/0144785 A1 | 10/2002 | Srivastava et al. | |
| 2002/0177001 A1 | 11/2002 | Harada et al. | |
| 2003/0000648 A1 | 1/2003 | Park et al. | |
| 2003/0010446 A1 | 1/2003 | Kajiyama et al. | |
| 2003/0019579 A1 * | 1/2003 | Ahn | 156/345.29 |
| 2003/0029563 A1 | 2/2003 | Kaushal et al. | |
| 2003/0084848 A1 | 5/2003 | Long | |
| 2003/0084849 A1 | 5/2003 | Shim | |
| 2003/0092278 A1 | 5/2003 | Fink | |
| 2003/0094135 A1 * | 5/2003 | Komiya et al. | 118/715 |
| 2003/0113479 A1 | 6/2003 | Fukuda et al. | |
| 2003/0150419 A1 | 8/2003 | Daragheh et al. | |
| 2003/0200929 A1 | 10/2003 | Otsuki | |
| 2003/0201069 A1 | 10/2003 | Johnson | |
| 2003/0227258 A1 | 12/2003 | Strang et al. | |
| 2004/0026372 A1 | 2/2004 | Takenaka et al. | |
| 2004/0035364 A1 | 2/2004 | Tomoyoshi et al. | |
| 2004/0040940 A1 | 3/2004 | Fink | |
| 2004/0050495 A1 | 3/2004 | Sumiya et al. | |
| 2004/0050516 A1 | 4/2004 | Nishimoto et al. | |
| 2004/0060656 A1 | 4/2004 | Saigusa et al. | |
| 2004/0060657 A1 | 4/2004 | Saigusa et al. | |
| 2004/0060658 A1 * | 4/2004 | Nishimoto et al. | 156/345.1 |
| 2004/0060661 A1 | 4/2004 | Nishimoto et al. | |
| 2004/0060779 A1 | 4/2004 | Kreger | |
| 2004/0061447 A1 | 4/2004 | Saigusa et al. | |
| 2004/0063333 A1 | 4/2004 | Saigusa et al. | |
| 2004/0072426 A1 | 4/2004 | Jung | |
| 2004/0074605 A1 | 4/2004 | Nezu et al. | |
| 2004/0081746 A1 | 4/2004 | Imafuku | |
| 2004/0083970 A1 | 5/2004 | Imafuku et al. | |
| 2004/0125359 A1 | 7/2004 | Ludviksson et al. | |
| 2004/0168640 A1 | 9/2004 | Muto et al. | |
| 2004/0173155 A1 | 9/2004 | Nishimoto et al. | |
| 2004/0216667 A1 | 11/2004 | Mitsuhashi et al. | |
| 2004/0244949 A1 | 12/2004 | Fink | |
| 2005/0011447 A1 | 1/2005 | Fink | |
| 2005/0041238 A1 | 2/2005 | Ludviksson et al. | |
| 2005/0098265 A1 | 5/2005 | Fink | |
| 2005/0103268 A1 * | 5/2005 | Nishimoto et al. | 118/715 |
| 2005/0103275 A1 | 5/2005 | Sasaki et al. | |
| 2005/0150866 A1 | 7/2005 | O'Donnell et al. | |
| 2005/0251990 A1 * | 11/2005 | Choi et al. | 29/558 |
| 2005/0255257 A1 * | 11/2005 | Choi et al. | 427/585 |
| 2006/0118045 A1 * | 6/2006 | Fink | 118/723 R |
| 2006/0134919 A1 | 6/2006 | Hamelin et al. | |
| 2006/0151114 A1 * | 7/2006 | Fink | 156/345.29 |
| 2006/0201662 A1 | 9/2006 | Gilbert et al. | |
| 2006/0228496 A1 * | 10/2006 | Choi et al. | 427/569 |

FOREIGN PATENT DOCUMENTS

| | | |
|---|---|---|
| EP | 03 26 318 | 8/1989 |
| EP | 0 508 731 | 10/1992 |
| EP | 0 573 057 | 12/1993 |
| EP | 0 799 904 | 10/1997 |
| EP | 0 814 495 | 12/1997 |
| EP | 0 841 838 | 5/1998 |
| EP | 1 069 603 | 1/2001 |
| EP | 1 081 749 | 7/2001 |
| EP | 1 156 130 | 11/2001 |
| GB | 2252567 | 8/1992 |
| JP | 59-186325 | 10/1984 |
| JP | 61-207566 | 9/1986 |
| JP | 62-067161 | 3/1987 |
| JP | 63-000450 | 1/1988 |
| JP | 64-039728 | 2/1989 |
| JP | 01-120328 | 5/1989 |
| JP | 01-312087 | 12/1989 |
| JP | 02-267967 | 11/1990 |
| JP | 03-115535 | 5/1991 |
| JP | 04-238882 | 8/1992 |
| JP | 05-070922 | 3/1993 |
| JP | 05-117064 | 5/1993 |
| JP | 05-121360 | 5/1993 |
| JP | 05-198532 | 8/1993 |
| JP | 05-238855 | 9/1993 |
| JP | 05-238859 | 9/1993 |
| JP | 06-011346 | 2/1994 |
| JP | 06-057396 | 3/1994 |
| JP | 06-136505 | 5/1994 |
| JP | 06-142822 | 5/1994 |
| JP | 06-196548 | 7/1994 |
| JP | 06-256926 | 9/1994 |
| JP | 06-287739 | 10/1994 |
| JP | 07-058013 | 3/1995 |
| JP | 07-126827 | 5/1995 |
| JP | 07-176524 | 7/1995 |
| JP | 07-226378 | 8/1995 |
| JP | 07-245295 | 9/1995 |
| JP | 08-037180 | 2/1996 |
| JP | 08-041309 | 2/1996 |
| JP | 08-081777 | 3/1996 |
| JP | 08-268751 | 10/1996 |
| JP | 08-339895 | 12/1996 |
| JP | 09-069554 | 3/1997 |
| JP | 09-228070 | 9/1997 |
| JP | 09-272987 | 10/1997 |
| JP | 10-004083 | 1/1998 |
| JP | 10-045461 | 2/1998 |
| JP | 10-045467 | 2/1998 |
| JP | 10-130884 | 5/1998 |
| JP | 10-214819 | 8/1998 |
| JP | 10-226869 | 8/1998 |
| JP | 10-251871 | 9/1998 |
| JP | 11-001757 | 1/1999 |
| JP | 11-080925 | 3/1999 |
| JP | 11-207161 | 8/1999 |
| JP | 11-233292 | 8/1999 |
| JP | 11-310451 | 11/1999 |
| JP | 11-312646 | 11/1999 |
| JP | 2000-119840 | 4/2000 |
| JP | 2000-124197 | 4/2000 |
| JP | 2000-303180 | 10/2000 |
| JP | 2001-031484 | 2/2001 |

| | | |
|---|---|---|
| JP | 2001-152307 | 6/2001 |
| JP | 2001-164354 | 6/2001 |
| JP | 2001-226773 | 8/2001 |
| JP | 2002-151473 | 5/2002 |
| JP | 2002-252209 | 9/2002 |
| JP | 2003-166043 | 6/2003 |
| KR | 1991-002451 | 4/1991 |
| KR | 1994-008937 | 9/1994 |
| KR | 1998-063542 | 10/1998 |
| KR | 1999-008142 | 1/1999 |
| KR | 1999-13565 | 2/1999 |
| KR | 2002-0027373 | 4/2002 |
| KR | 10-2004-0007601 | 1/2004 |
| WO | WO 99/50886 | 10/1999 |
| WO | WO 01/42526 | 6/2001 |
| WO | WO 02/39495 | 5/2002 |
| WO | WO 02/48421 | 6/2002 |
| WO | WO 2004/030011 | 4/2004 |
| WO | WO 2004/030012 | 4/2004 |
| WO | WO 2004/030013 | 4/2004 |
| WO | WO 2004/030014 | 4/2004 |
| WO | WO 2004/030015 | 4/2004 |
| WO | WO 2004/030020 | 4/2004 |
| WO | WO 2004/030426 | 4/2004 |
| WO | WO 2004/095530 | 11/2004 |
| WO | WO 2004/095532 | 11/2004 |

OTHER PUBLICATIONS

Final Office Action issued in U.S. Appl. No. 11/091,775 mailed Mar. 5, 2009.
www.zircaceramics.com, Product Information, Dec. 22, 2004.
Production drawing for Deposition Shield, Upper believed to be sold in the U.S. on Apr. 12, 2000.
Production drawing for Deposition Shield believed to be sold in the U.S. prior to Sep. 30, 2001.
Production drawing for Upper Electrode believed to be sold in the U.S. prior to Sep. 30, 2001.
Hee Jee Kim, "Plasma-Sprayed Alumina-Yttria ceramic Coatings for Caviation-Erosion Protection," Sep. 1989, pp. 139-146.
JIS Using Series, "Spraying Techniques Manual", p. 95 (Oct. 30, 1998, Japanese Standard Association), with English translation.
Yousha Gitjutsu Handbook, 1st Edition, Japan Thermal Spraying Society, Techno Consultants, Inc., pp. 3, 316-317 (1998).
Office Action in U.S. Appl. No. 11/091,775, mailed Oct. 6, 2008.
Office Action in U.S. Appl. No. 10/889,220, mailed Nov. 30, 2006.
Office Action in U.S. Appl. No. 10/889,220, mailed Jun. 21, 2006.
http://lionreference.chadwyck.com/searchFulltext.do?id=15804750&idType=offset&divLevel=2&queryId=../session/1164482997_16084&area=mwd&forward=refshelf&trail=refshelf.
Office Action in U.S. Appl. No. 11/567,023, mailed May 5, 2008.
Office Action in U.S. Appl. No. 11/584,525, mailed Jul. 1, 2008.
Office Action in U.S. Appl. No. 11/581,000, mailed May 15, 2008.
Office Action in U.S. Appl. No. 10/450,094, mailed Dec. 1, 2005.
Office Action in U.S. Appl. No. 10/450,094, mailed Aug. 15, 2006.
Office Action in U.S. Appl. No. 10/450,094, mailed Mar. 20, 2007.
Office Action in U.S. Appl. No. 10/450,094, mailed Jan. 7, 2008.
Office Action in U.S. Appl. No. 11/980,570, mailed Jul. 25, 2008.
Office Action in U.S. Appl. No. 11/980,596, mailed Jul. 29, 2008.
Office Action in U.S. Appl. No. 10/444,957, mailed Jun. 9, 2004.
Office Action in U.S. Appl. No. 10/444,957, mailed Nov. 18, 2004.
Office Action in U.S. Appl. No. 10/444,957, mailed Jun. 7, 2005.
Office Action in U.S. Appl. No. 10/444,957, mailed Nov. 7, 2005.
Office Action in U.S. Appl. No. 10/444,957, mailed Aug. 1, 2006.
Office Action in U.S. Appl. No. 10/444,957, mailed Apr. 25, 2007.
Office Action in U.S. Appl. No. 10/444,957, mailed Oct. 5, 2007.
Office Action in U.S. Appl. No. 10/444,957, mailed Jul. 28, 2008.
Office Action in U.S. Appl. No. 10/722,602, mailed Mar. 2, 2006.
Office Action in U.S. Appl. No. 10/722,602, mailed Aug. 17, 2006.
Office Action in U.S. Appl. No. 10/722,602, mailed May 4, 2007.
Office Action in U.S. Appl. No. 10/722,602, mailed Oct. 25, 2007.
Office Action in U.S. Appl. No. 10/722,602, mailed May 21, 2008.

English language abstract of JP 01-312087, published Dec. 1989.
English language abstract of JP 02-267967, published Nov. 1990.
English language abstract of JP 03-115535, published May 1991.
English language abstract of JP 04-238882, published Aug. 1992.
Machine English language translation of JP 05-070922, published Mar. 1993.
Machine English language translation of JP 05-117064, published May 1993.
Machine English language translation of JP 05-121360, published May 1993.
Machine English language translation of JP 05-198532, published Aug. 1993.
Machine English language translation of JP 05-238859, published Sep. 1993.
Machine English language translation of JP 06-057396, published Mar. 1994.
Machine English language translation of JP 06-36505, published May 1994.
Machine English language translation of JP 06-142822, published May 1994.
Machine English language translation of JP 06-256926, published Sep. 1994.
Machine English language translation of JP 07-058013, published Mar. 1995.
Machine English language translation of JP 07-126827, published May 1995.
Machine English language translation of JP 07-176524, published Jul. 1995.
Machine English language translation of JP 07-226378, published Aug. 1995.
Machine English language translation of JP 07-245295, published Sep. 1995.
Machine English language translation of JP 08-037180, published Feb. 1996.
Machine English language translation of JP 08-041309, published Feb. 1996.
Machine English language translation of JP 08-081777, published Mar. 1996.
Machine English language translation of JP 08-268751, published Oct. 1996.
Machine English language translation of JP 08-339895, publishec Dec. 1996.
Machine English language translation of JP 09-069554, published Mar. 1997.
Machine English language translation of JP 09/272987, published Oct. 1997.
Machine English language translation of JP 10-004083, published Jan. 1998.
Machine English language translation of JP 10-045461, published Feb. 1998.
Machine English language translation of JP 10-045467, published Feb. 1998.
Machine English language translation of JP 10-130884, published May 1998.
Machine English language translation of JP 10-214819, published Aug. 1998.
Machine English language translation of JP 10-251871, published Sep. 1998.
Machine English language translation of JP 11-080925, published Mar. 1999.
Machine English language translation of JP 11-207161, published Aug. 1999.
Machine English language translation of JP 11-233292, published Aug. 1999.
Machine English language translation of JP 11-312646, published Nov. 1999.
Machine English language translation of JP 2000-124197, published Apr. 2000.
Machine English language translation of JP 2000-303180, published Oct. 2000.
Machine English language translation of JP 2001-031484, published Feb. 2001.

Machine English language translation of JP 2001-152307, published Jun. 2001.
Machine English language translation of JP 2001-164354, published Jun. 2001.
Machine English language translation of JP 2001-226773, published Aug. 2001.
Machine English language translation of JP 2002-151473, published May 2002.
Machine English language translation of JP 2000-119840, published Apr. 2000.
Machine English language translation of JP 06-011346, published Feb. 1994.
English language abstract of JP 01-120328, published May 1989.
Machine English language translation of JP 11-310451, published Nov. 1999.
Machine English language translation of JP 05-238855, published Sep. 1993.
Machine English language translation of JP 06-196548, published Jul. 1994.
Machine English language translation of JP 06-287739, published Oct. 1994.
Machine English language translation of JP 09-228070, published Sep. 1997.
Machine English language translation of JP 10-226869, published Aug. 1998.
Machine English language translation of JP 11-001757, published Jan. 1999.
English language abstract of JP 61-207566, published Sep. 1986.
English language abstract of JP 64-039728, published Feb. 1989.
English language abstract of JP 62-067161, published Mar. 1987.
English language abstract of JP 63-000450, published Jan. 1988.
International Search Report issued in International Application No. PCT/US05/36873, mailed Oct. 24, 2006.
Written Opinion issued in International Application No. PCT/US05/36873, mailed Oct. 24, 2006.
Office Action in U.S. Appl. No. 10/889,220, mailed Nov. 30, 2006.
Office Action in U.S. Appl. No. 10/889,220, mailed Jun. 21, 2006.
Office Action in U.S. Appl. No. 10/705,224, mailed Apr. 24, 2008.
Office Action in U.S. Appl. No. 10/705,224, mailed Jan. 18, 2008.
Office Action in U.S. Appl. No. 10/705,224, mailed Apr. 5, 2007.
Office Action in U.S. Appl. No. 10/705,224, mailed Mar. 7, 2006.
Office Action in U.S. Appl. No. 10/705,224, mailed Jun. 29, 2005.
Machine English language translation of JP 2002-252209, published Sep. 2002.
Machine English language translation of JP 2003-166043, published Jun. 2003.
Office Action issued on Taiwanese Application No. 93134237, mailed Jul. 16, 2007.
English language translation of Office Action issued in Taiwanese Application No. 93134237, mailed Jul. 16, 2007.
Office Action issued in U.S. Appl. No. 11/032,101, mailed Nov. 14, 2008.
International Search Report of PCT/US06/000591 issued Sep. 21, 2007.

* cited by examiner

METHOD AND APPARATUS FOR IMPROVED BAFFLE PLATE

FIELD OF THE INVENTION

The present invention relates to a method and apparatus for utilizing a baffle plate in a plasma processing system, and methods of making the same.

BACKGROUND OF THE INVENTION

The fabrication of integrated circuits (IC) in the semiconductor industry typically employs plasma to create and assist surface chemistry within a vacuum processing system necessary to remove material from and deposit material to a substrate. In general, plasma is formed within the processing system under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the system (e.g., etching processes where materials are removed from the substrate or deposition processes where materials are added to the substrate).

In the prior art, plasma has been attenuated in the process chamber utilizing various baffle plates. One function of the attenuation has been to improve the confinement of the plasma in the process chamber. Another function of these plates has been to keep plasma from entering areas where harm could occur to mechanical components. Prior baffle plate designs utilize slots or orifices of various configurations to attenuate or confine the plasma. Typical baffle plates utilize hundreds of slot features or thousands of orifice features. These slot and orifice features add considerable cost to produce the typical baffle plate.

SUMMARY OF THE INVENTION

The present invention relates to a method of fabricating a baffle plate assembly, surrounding a substrate holder in a plasma processing system comprised of forming a baffle plate blank and subsequently forming one or more pumping passageways wherein one or more features of the baffle plate blank are modified by planar material removal forming the pumping passages.

The present invention also relates to a baffle plate assembly, which surrounds a substrate holder in a plasma processing system and comprises a baffle plate blank having one or more pumping passages wherein one or more features of the baffle plate blank are modified by planar material removal forming the pumping passages.

The present invention also relates to a plasma process apparatus with baffle a plate assembly comprising a process chamber, a plasma generating system configured and arranged to produce a plasma in the process chamber, a gas source configured to introduce gases into the process chamber, a pressure control system to maintain a selected pressure within the process chamber, a substrate holder configured to hold a substrate during substrate processing, and a baffle plate assembly. The baffle plate assembly is disposed radially outward from the substrate and formed from a baffle plate blank with one or more pumping passages formed from planar material removal from the baffle plate blank.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention wherein.

DESCRIPTION OF THE PREFERRED EMBODIMENTS

In plasma processing, a baffle plate can be employed to aid in confining the plasma to the processing region adjacent to the substrate, as well as to effect the uniformity of fluid mechanic properties in the processing region adjacent to the substrate. For conventional plasma processing systems, the baffle plate is configured to surround the substrate holder and, in many cases, the baffle plate is physically coupled to the substrate holder using fasteners. In general, the baffle plate comprises a plurality of openings to permit the passage of process gasses, reactants and reaction products to the vacuum pumping system.

Figure 1:
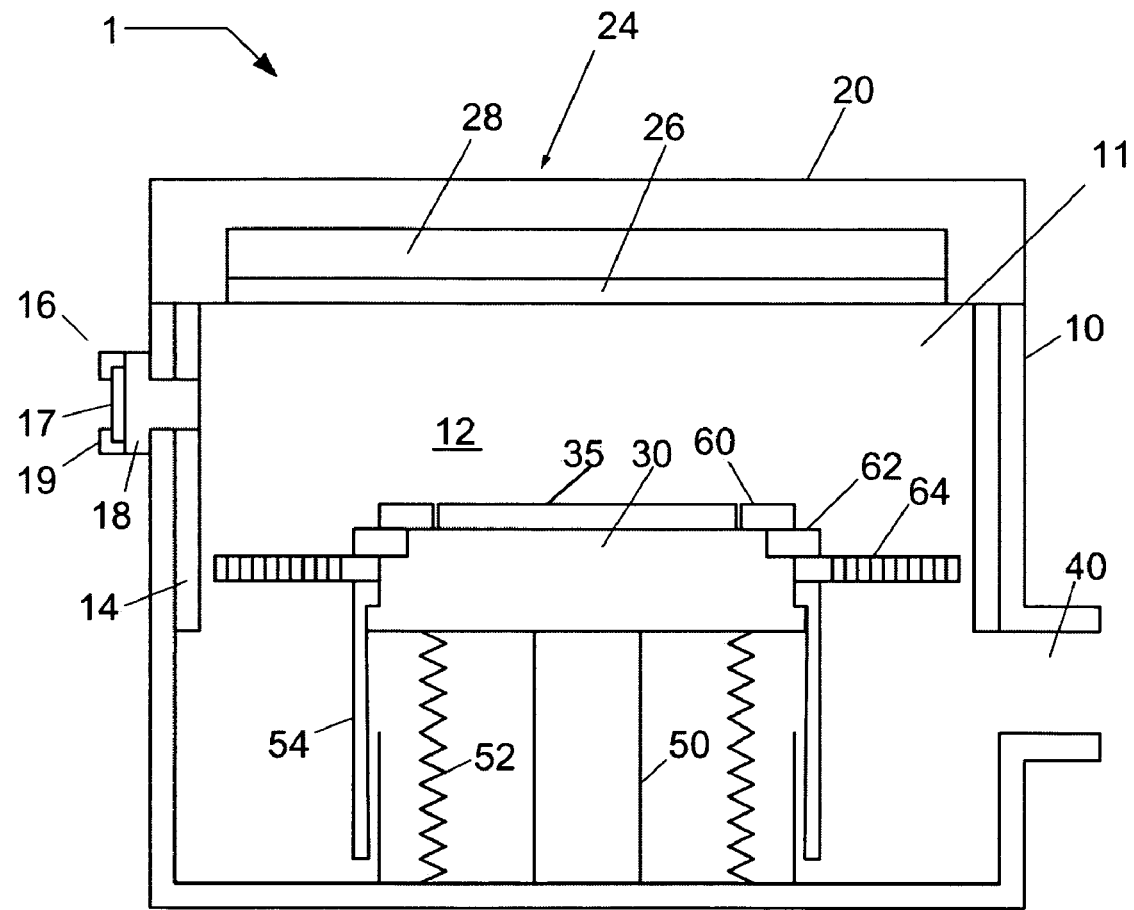
FIG. 1 illustrates a schematic block diagram of a plasma processing system according to an embodiment of the present invention.

According to an embodiment of the present invention, a plasma processing system 1 is depicted in FIG. 1 comprising a plasma processing chamber 10, an upper assembly 20, an electrode plate assembly 24, a substrate holder 30 for supporting the substrate 35, and a pumping duct 40 coupled to a vacuum pump (not shown) for providing a reduced pressure atmosphere 11 in plasma processing chamber 10. Plasma processing chamber 10 can facilitate the formation of a process plasma in process space 12 adjacent to the substrate 35. The plasma processing system 1 can be configured to process substrates of any size, such as 200 mm substrates, 300 mm substrates, or larger.

In the illustrated embodiment, electrode plate assembly 24 comprises an electrode plate 26 and an electrode 28. In an alternate embodiment, upper assembly 20 can also comprise a cover, a gas injection assembly, and/or an upper impedance match network. The electrode plate assembly 24 can be coupled to an RF source. In another alternate embodiment, the upper assembly 20 comprises a cover coupled to the electrode plate assembly 24, wherein the electrode plate assembly 24 is maintained at an electrical potential equivalent to that of the plasma processing chamber 10. For example, the plasma processing chamber 10, the upper assembly 20, and the electrode plate assembly 24 can be electrically connected to ground potential.

Plasma processing chamber 10 can further comprise an optical viewport 16 coupled to a deposition shield. Optical viewport 16 can comprise an optical window 17 coupled to the backside of an optical window deposition shield 18, and an optical window flange 19 can be configured to couple the optical window 17 to the optical window deposition shield 18. Sealing members, such as O-rings, can be provided between the optical window flange 19 and the optical window 17, between the optical window 17 and the optical window deposition shield 18 and the plasma processing chamber 10. Optical viewport 16 can permit monitoring of optical emission from the processing plasma in process space 12.

Substrate holder 30 can further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can be coupled to the substrate holder 30 and configured to protect the bellows 52 from the processing plasma. Substrate holder 10 can further be coupled to a focus ring 60, and/or a shield ring 62. Furthermore, a baffle plate 64 can extend about a periphery of the substrate holder 30.

Substrate 35 can be transferred into and out of plasma processing chamber 10 through a slot valve (not shown) and/or a chamber feed-thru (not shown) via a robotic substrate transfer system where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be affixed to the substrate holder 30 via an electrostatic clamping system, or a mechanical clamping system. Furthermore, substrate holder 30 can further include a cooling system including a re-circulating coolant flow that receives heat from the substrate holder 30 and transfers heat to a heat exchanger system (not shown), or when heating, transfers heat from the heat exchanger system. Moreover, gas can be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermo-electric heaters/coolers can be included.

In the illustrated embodiment shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from approximately 1 MHz to approximately 100 MHz and can be approximately 13.56 MHz. RF systems for plasma processing are well known to those skilled in the art.

Alternately, the processing plasma in process space 12 can be formed using a parallel-plate, capacitively coupled plasma (CCP) source, or an inductively coupled plasma (ICP) source, or any combination thereof, and with or without magnet systems. Alternately, the processing plasma in process space 12 is formed from the launching of a Helicon wave. In yet another embodiment, the processing plasma in process space 12 is formed from a propagating surface wave.

Figure 2:
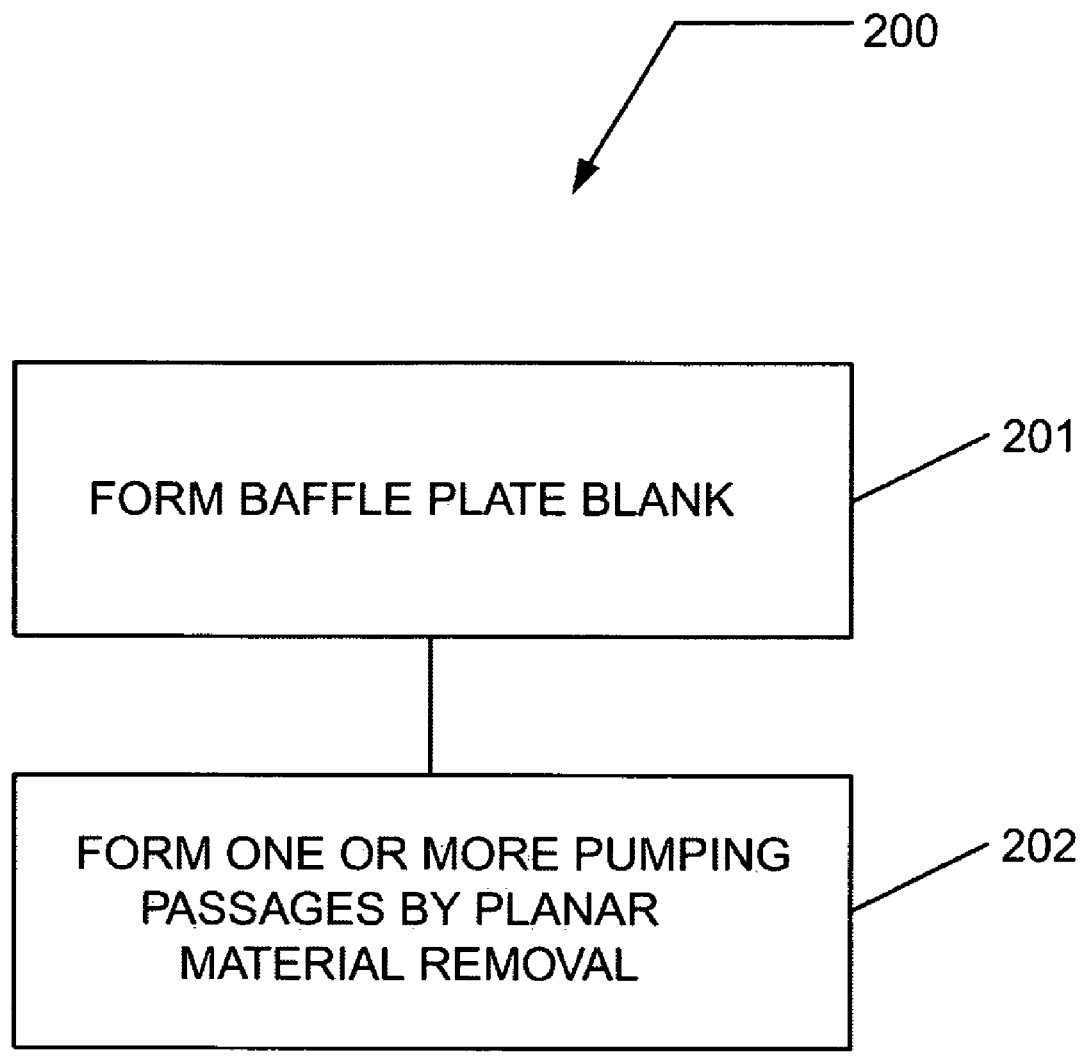
FIG. 2 presents a method of fabricating a baffle plate assembly, surrounding a substrate holder in a plasma processing system.

Referring now to FIG. 2, a method of fabricating a baffle plate assembly, surrounding a substrate holder in a plasma processing system is described. As shown in FIG. 2, the method begins in 201 with first forming a baffle plate blank. The baffle plate blank is configured with one or more features that when modified by planar material removal form pumping passageways in the baffle plate blank, thus forming a baffle plate assembly. The baffle plate blank, including features to be modified, can be formed by metal casting, metal stamping, machining, ceramic fabrication, molding, or quartz fabrication, or any combination thereof. In 202, one or more pumping passageways are formed in the baffle plate blank by planar surface removal of the baffle plate blank. Planar material removal can be performed on at least one portion of one surface of the baffle plate blank. Planar surface removal to baffle plate blank can be performed by milling, grinding, lapping, sanding, planning and/or etching. The planar surface removal process can be a single operation.

Figure 3A:
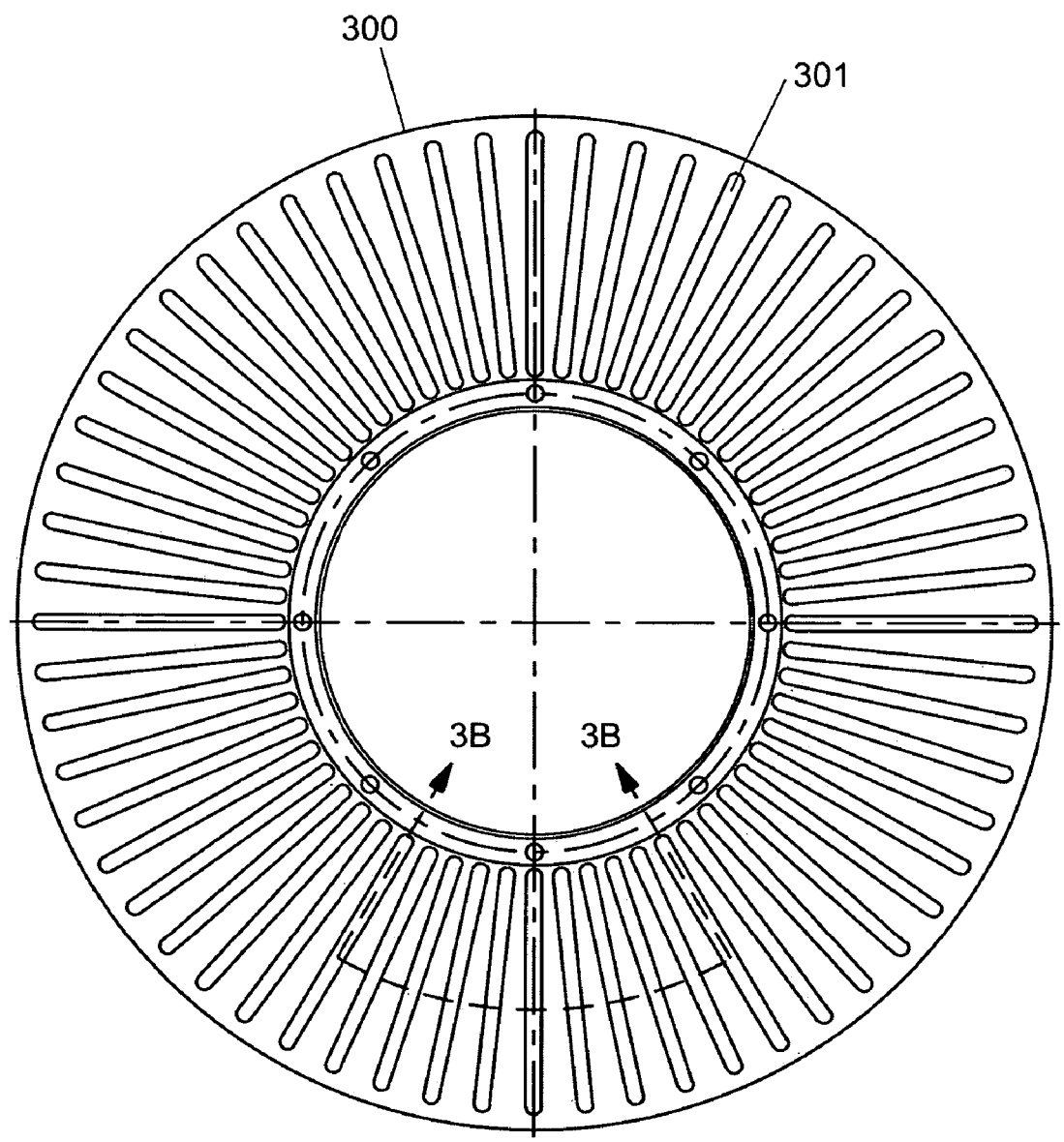
FIG. 3A presents a plan view of a baffle plate blank according to the present invention.
Figure 3B:
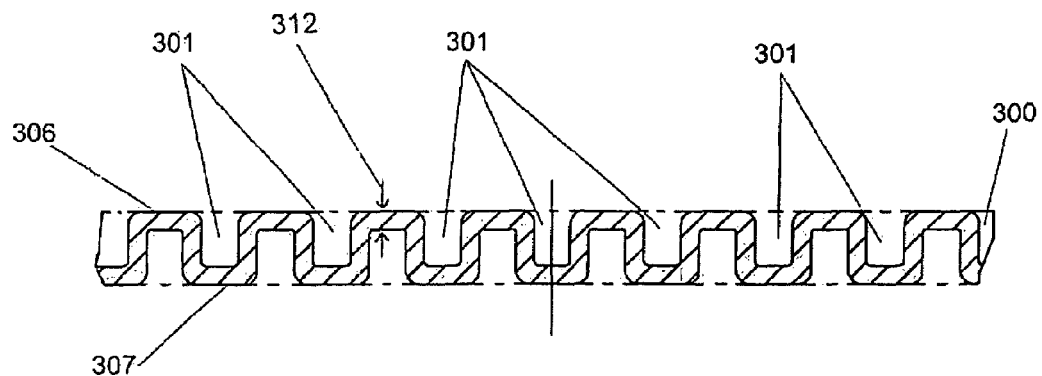
FIG. 3B presents a cross-sectional view of the baffle plate blank of FIG. 3A.
Figure 3C:
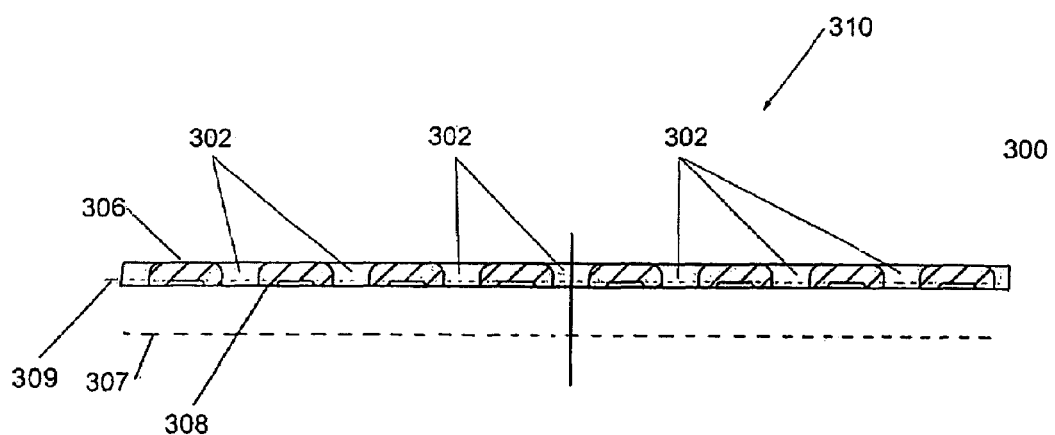
FIG. 3C presents a cross-sectional view of the baffle plate blank of FIG. 3B, after planar material removal.

Referring now to an illustrated embodiment of the present invention as depicted in FIG. 3A, FIG. 3B and FIG 3C. Baffle plate blank 300 is configured to be capable of surrounding a substrate holder in a plasma processing system. The baffle plate blank 300 is made from aluminum, alumina, silicon, quartz, carbon, silica nitride, and/or ceramic. The baffle plate blank 300 is configured with one or more closed pumping features 301. FIG. 3B identifies a cross-sectional view of baffle plate blank 300 illustrating several closed pumping features 301. As shown in FIG. 3B, the baffle plate blank 300 has a profile with multiple variations in a direction perpendicular to a surface of the baffle plate blank 300. Baffle plate blank 300 has an upper surface 306 and a lower surface 307. As shown in. FIG. 3B, the thickness of the variations (e.g., the distance, between upper surface 306 and lower surface 307) is greater than the thickness 312 of a plate from which the baffle plate blank 300 is formed. As illustrated in FIG. 3C, when lower surface 307 is modified, i.e. at least some of the multiple variations are modified, by planar material removal to form a new lower surface 308, open pumping passages 302 are formed in the baffle plate blank 300, thus forming a baffle plate assembly 310. As shown in FIG. 3C, the walls of the. open pumping passages 302 protrude from the planar surface 309 of the plate 300. These protrusions are remnants of the multiple variations in the direction perpendicular to the surface 306 of the baffle plate blank 300 after planar removal of material to form the new lower surface 308.

Furthermore a protective barrier can be formed on any surface of the baffle plate assembly 310. The protective barrier can, for example, facilitate the provision of an erosion resistant surface when the baffle plate assembly 310 is exposed to harsh processing environments, such as plasma. The protective barrier can be formed by providing a surface anodization on one or more surfaces, providing a spray coating on one or more surfaces, and/or subjecting one or more surfaces to plasma electrolytic oxidation. The protective barrier can comprise a layer of a III-column element and/or a Lanthanon element. The protective barrier can comprise $Al_2O_3$, Yttria ($Y_2O_3$), $Sc_2O_3$, $Sc_2F_3$, $YF_3$, $La_2O_3$, $CeO_2$, $Eu_2O_3$, and/or $DyO_3$. Methods of anodizing aluminum components and applying spray coatings are well known to those skilled in the art of surface material treatment.

All surfaces on the baffle plate assembly 310 can be provided with the protective barrier, applied using any of the techniques described above. In another example, all surfaces on the baffle plate 310, except for a selected portion of a surface or surfaces, can be provided with the protective barrier, applied using any of the techniques described above. Prior to the application of the protective barrier to the surfaces of the baffle plate assembly 310, any region can be masked in order to prevent the formation of the barrier layer thereon. Alternatively, following the application of the protective barrier to the surfaces of the baffle plate assembly 310 any region can be processed to remove the barrier layer formed thereon.

Figure 4A:
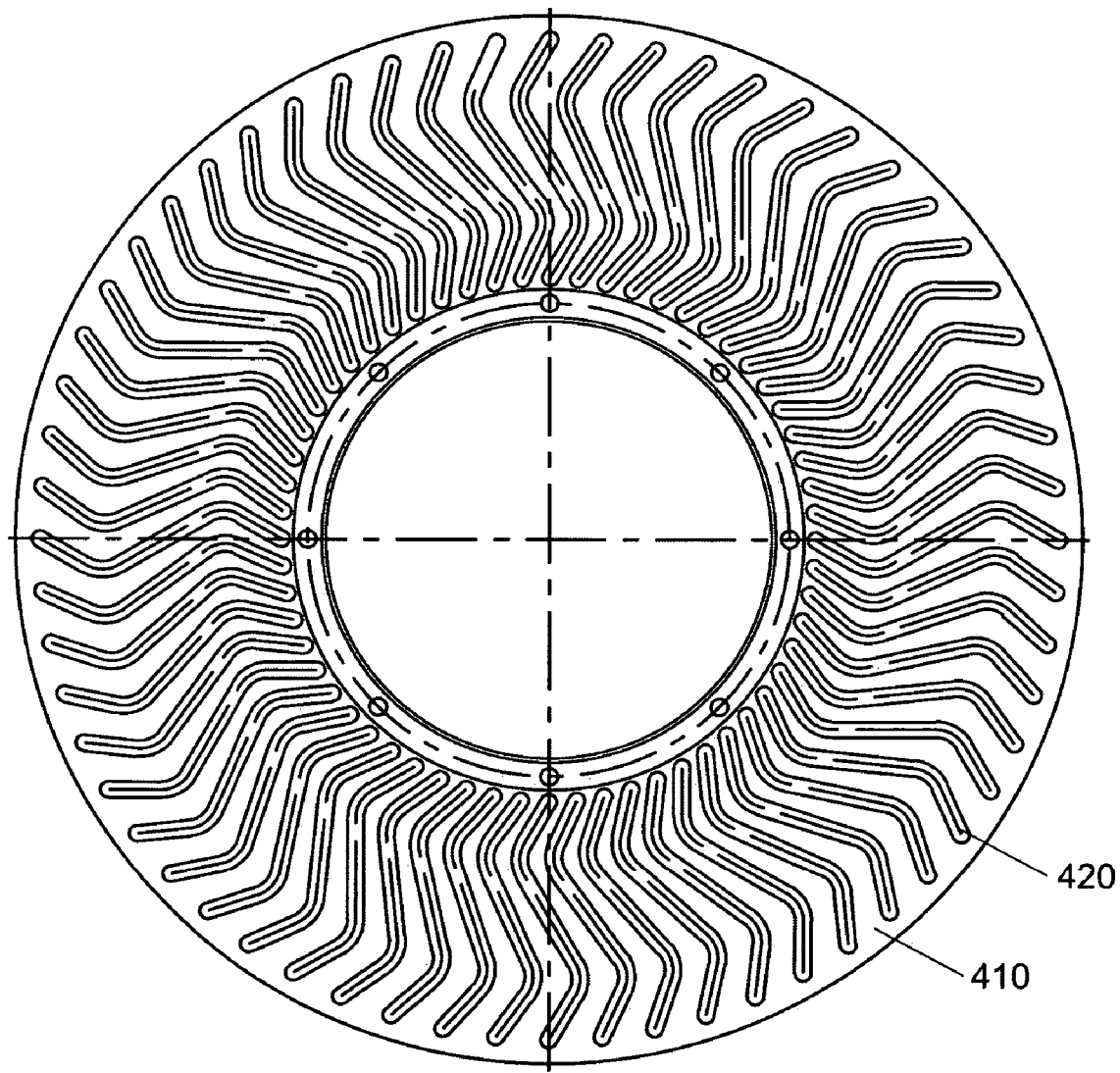
FIG. 4A presents a plan view of a baffle plate according to another embodiment of the present invention.

In the embodiment shown in FIG. 3A, FIG. 3B, and FIG. 3C, the one or more pumping passages 302 can comprise slots aligned in a radial direction. As shown, the slots can be spaced evenly azimuthally. In an alternate embodiment of the present invention, the slots can be spaced unevenly azimuthally. In an alternate embodiment of the present invention, the slots can be slanted and, therefore aligned, evenly partially in a radial direction and an azimuthal direction. In an alternate embodiment of the present invention, the slots can be slanted and, therefore aligned, unevenly partially in a radial direction and an azimuthal direction. In an alternate embodiment of the present invention the slots can be complex geometries aligned radially, slanted, evenly spaced and/or unevenly spaced. Indeed, the slots or other openings can be of any desired configuration. For example, FIG. 4A identifies a baffle plate assembly 410 with pumping passages 420 configured in a complex slot configuration, centered with respect to the baffle plate assembly 410 and evenly spaced azimuthally.

Figure 4B:
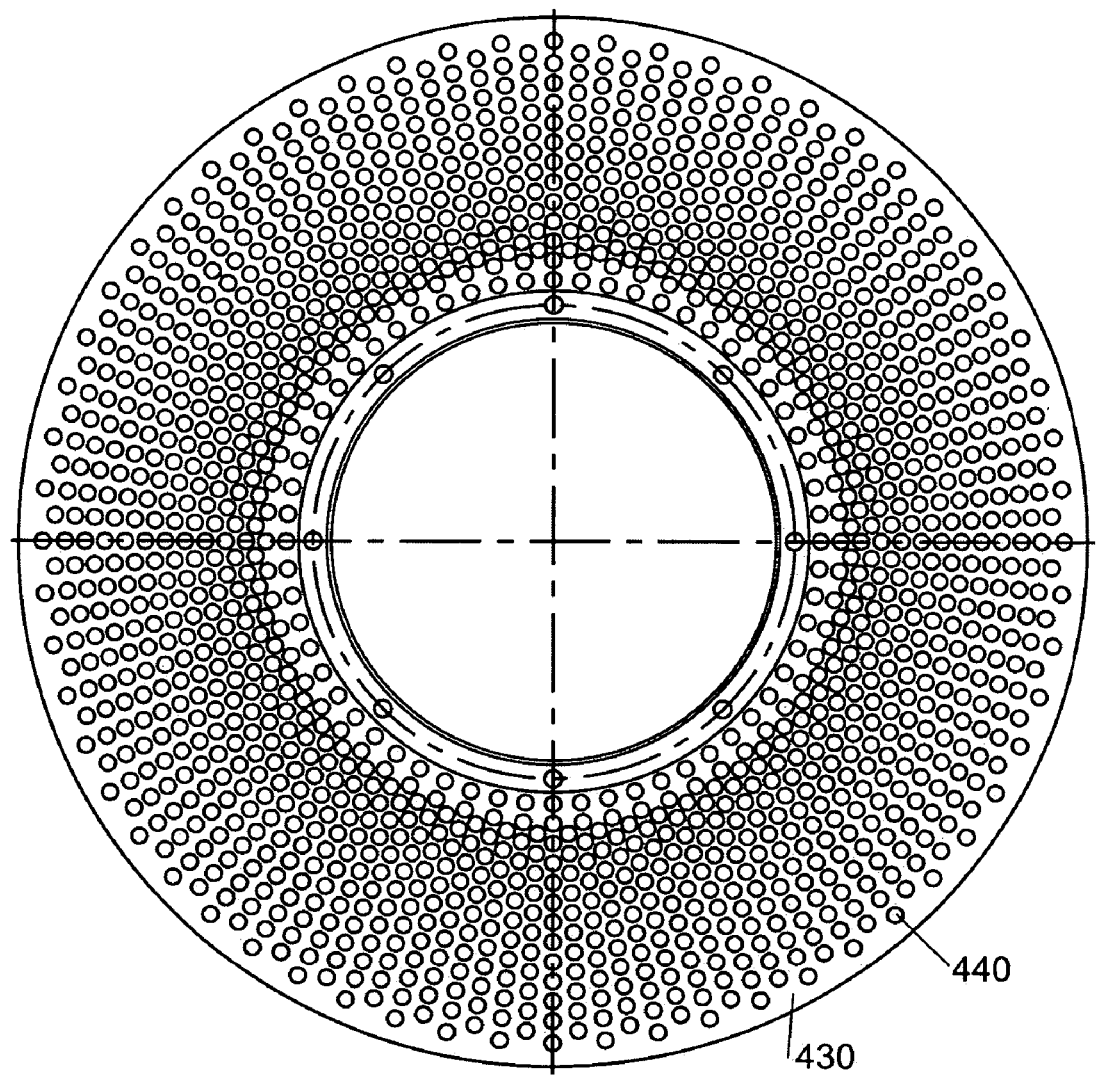
FIG. 4B presents a plan view of a baffle plate according to another embodiment of the present invention.

Alternately the pumping passages can include at least one orifice. Alternately, as shown in FIG. 4B, the pumping passages 440 comprise a plurality of orifices having a constant size and uniform distribution on the baffle plate assembly 430. Alternately the pumping passages can comprise a plurality of orifices, wherein the orifice size, distribution (or number density), and/or orifice shape varies across a baffle plate assembly. For example, when a vacuum pump (not shown) accesses a processing chamber 10 through a pumping duct 40, as shown in FIG. 1, the number of pumping passages can be reduced local to the entrance to the pumping duct 40 in order to correct for the non-uniform pressure field inherent to such an arrangement.

Alternately pumping passages can include at least one slot and at least one orifice. Varieties of alternate arrangements of these pumping features can utilize any of the alternates described above or any other shape or configuration.

Figure 4C:
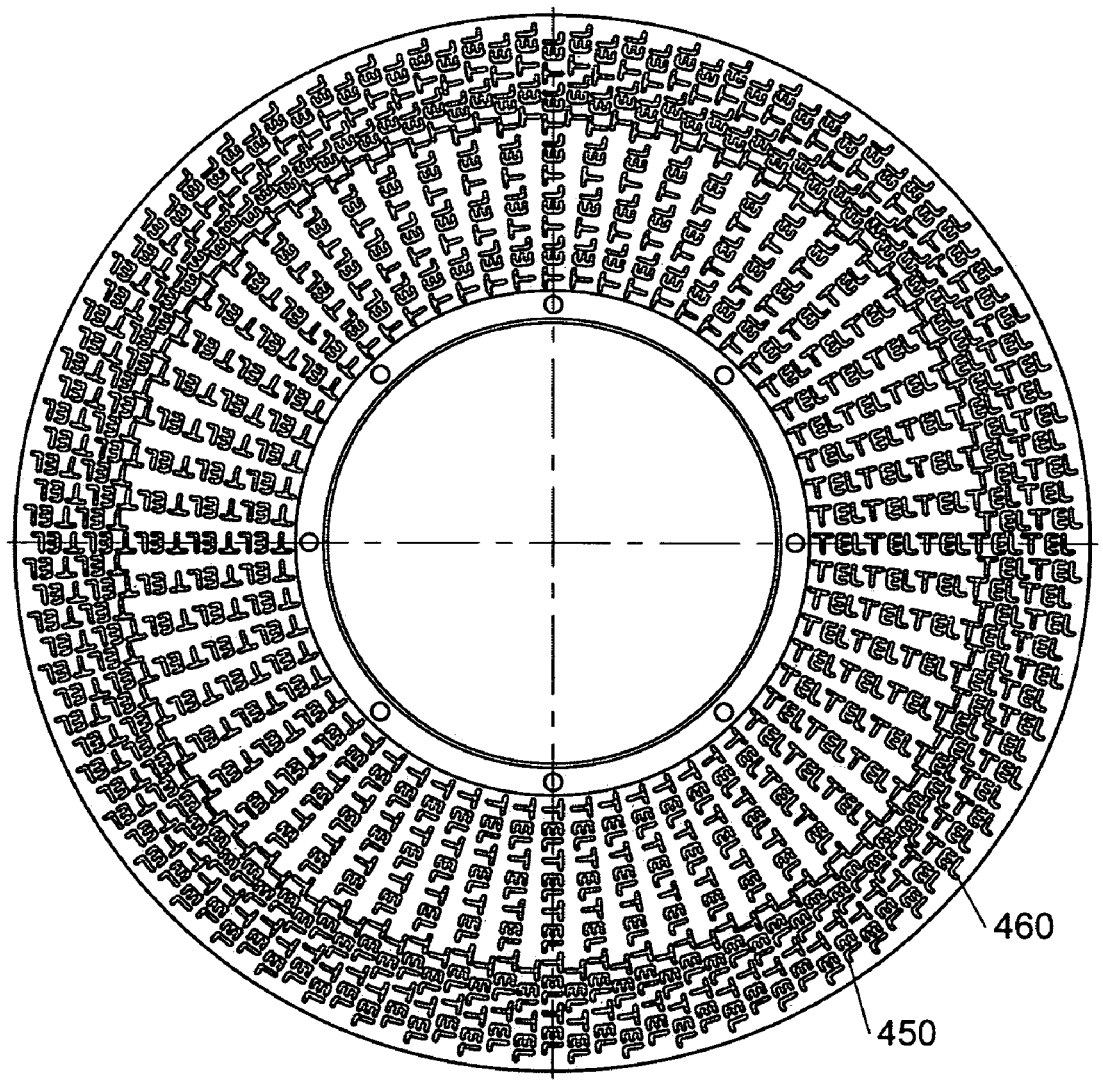
FIG. 4C presents a plan view of a baffle plate according to another embodiment of the present invention.

The orifice described above can be a round hole, a polygon, an icon, letters of any language and/or any open geometric shape. For example, FIG. 4C identifies a baffle plate assembly 450 with multiple orifices 460, comprised of English language characters.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method of fabricating a baffle plate assembly, surrounding a substrate holder in a plasma processing system comprising:
   providing a plate having a surface and a thickness;
   forming a baffle plate blank from the plate by forming multiple variations in a direction perpendicular to the surface of the plate, the multiple variations having a depth in the direction perpendicular to the surface of the plate greater than the thickness of the plate; and
   modifying in a single operation by planar material removal at least some of the multiple variations of said baffle plate blank to create one or more pumping passageways.

2. A method according to claim 1 wherein said forming of said baffle plate blank includes metal casting, metal stamping, machining, ceramic fabrication, molding, or quartz fabrication, or any combination thereof.

3. A method according to claim 1, wherein said planar material removal modification to said blank baffle plate blank comprises milling, grinding, lapping, sanding, planing, or etching, or any combination thereof.

4. A method according to claim 1, wherein the forming of the baffle plate blank includes forming the baffle plate blank from a plate made from aluminum, alumina, silicon, quartz, carbon, silicon nitride, silicon carbide, or ceramic, or any combination thereof.

5. A method according to claim 1, further comprising forming a protective barrier on a surface of said baffle plate assembly.

6. A method according to claim 1, further comprising forming a protective barrier on a portion of a surface of said baffle plate assembly.

7. A method according to claim 5 or 6, wherein the forming of said protective barrier comprises forming the protective barrier by surface anodization, by coating using plasma electrolytic oxidation, or by spray coating, or any combination thereof.

8. A method according to claim 5 or 6, wherein the forming of said protective barrier comprises forming a layer of one or more III-column elements or one or more Lanthanon elements, or any combination thereof.

9. A method according to claim 8, wherein said one or more III-column elements comprise Yttrium, Scandium, or Lanthanum, or any combination thereof.

10. A method according to claim 8, wherein said one or more Lanthanon elements comprise Cerium, Dysprosium, or Europium, or any combination thereof.

11. A method according to claim 5 or 6, wherein the forming of said protective barrier comprises forming $Al_2O_3$, Yttria ($Y_2O_3$), $Sc_2O_3$, $Sc_2F_3$, $YF_3$, $La_2O_3$, $CeO_2$, $Eu_2O_3$, or $DyO_3$, or any combination thereof.

12. A method according to claim 1, wherein the modifying includes creating one or more of said pumping passages comprising a slot, or an orifice, or any combination thereof.

13. A method according to claim 12, wherein the modifying includes creating an orifice having a shape and design of a round hole, a polygon, an icon, one or more letters of any language, or any open geometric shape.

14. A method according to claim 1, wherein the modifying to create the one or more pumping passageways includes creating pumping passageways with a variable size, shape or distribution, or any combination thereof, on said baffle plate assembly.

15. A method according to claim 1, wherein the forming of the baffle plate blank from the plate includes forming a baffle plate blank having no holes in the vicinity of the multiple variations of said baffle plate blank.

16. A method according to claim 1, wherein the forming of the baffle plate blank from the plate includes forming variations in the plate without creating openings in the plate.

* * * * *